United States Patent [19]

Iwahashi et al.

[11] 4,425,632

[45] Jan. 10, 1984

[54] NONVOLATILE SEMICONDUCTOR MEMORY DEVICE

[75] Inventors: Hiroshi Iwahashi, Yokohama; Masamichi Asano, Musashino, both of Japan

[73] Assignee: Tokyo Shibaura Denki Kabushiki Kaisha, Kawasaki, Japan

[21] Appl. No.: 180,991

[22] Filed: Aug. 25, 1980

[30] Foreign Application Priority Data

Aug. 29, 1979 [JP] Japan .................. 54-110057

[51] Int. Cl.$^3$ .................................................. G11C 7/00
[52] U.S. Cl. ............................................ 365/189; 365/185
[58] Field of Search ....................... 365/184, 185, 189

[56] References Cited

U.S. PATENT DOCUMENTS

| 3,836,894 | 9/1974 | Cricchi | 365/184 |
| 4,301,518 | 11/1981 | Klass | 365/185 |

FOREIGN PATENT DOCUMENTS

| 813537 | 5/1969 | Canada | 365/185 |
| 2445078 | 4/1976 | Fed. Rep. of Germany | 365/185 |
| 2306504 | 3/1976 | France | 365/185 |
| 2353116 | 5/1977 | France | |
| 52-32719 | 8/1977 | Japan | |

OTHER PUBLICATIONS

IEEE Transactions on Electron Devices, vol. ED-24, No. 5, May 1977, pp. 606-610, New York (USA); B. Rossler: "Electrically Erasable and Reprogrammable Read-Only Memory Using the n-Channel SIMOS One-Transistor Cell", p. 606, col. 2, line 11; p. 607, col. 1, line 7; p. 608, col. 1, lines 35-38, p. 608, col. 2, line 12-16.

Patents Abstracts of Japan, vol. 2, No. 65, 5/18/78, p. 2307 E 78; Japanese Kaoki No. 53682 issued to Ishikawa (Toshiba) & JP-A-53 32 682 (Toshiba) (3/28/78).

IEEE International Electron Devices Meeting, Washington, Dec. 4-6, 1978, pp. 478-482, New York (USA): E. Sun et al.: "Breakdown Mechanism in Short-Channel MOS Transistors", p. 3, lines 28-40.

Primary Examiner—Stuart N. Hecker
Attorney, Agent, or Firm—Finnegan, Henderson, Farabow, Garrett and Dunner

[57] ABSTRACT

There is provided a nonvolatile semiconductor memory device which comprises memory cells arranged in the form of a matrix and formed of MOS FET's each having a floating gate, a plurality of word lines each coupled to memory cells on the same row, and a plurality of data lines each coupled to memory cells on the same column. In this semiconductor memory device, the sources of the MOS FET's forming the memory cells are coupled to a resistor.

39 Claims, 18 Drawing Figures

F I G. 8
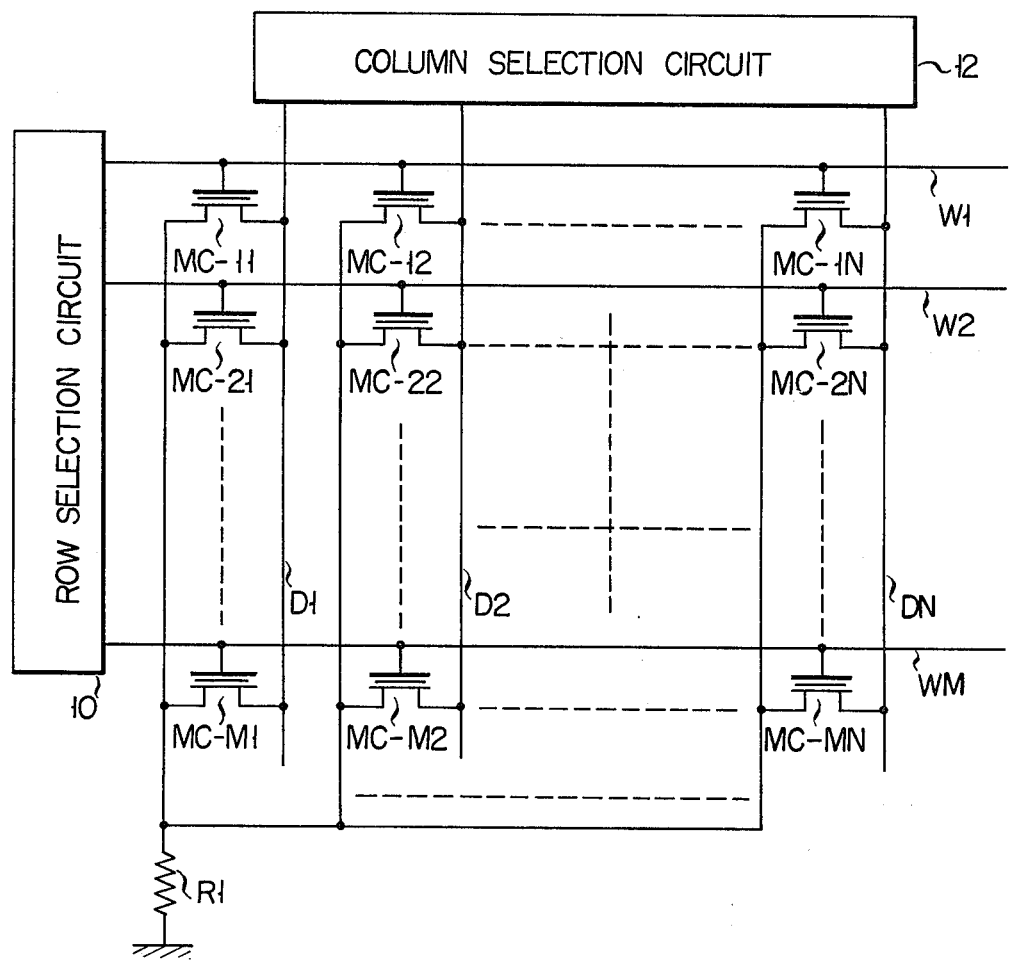

F I G. 10
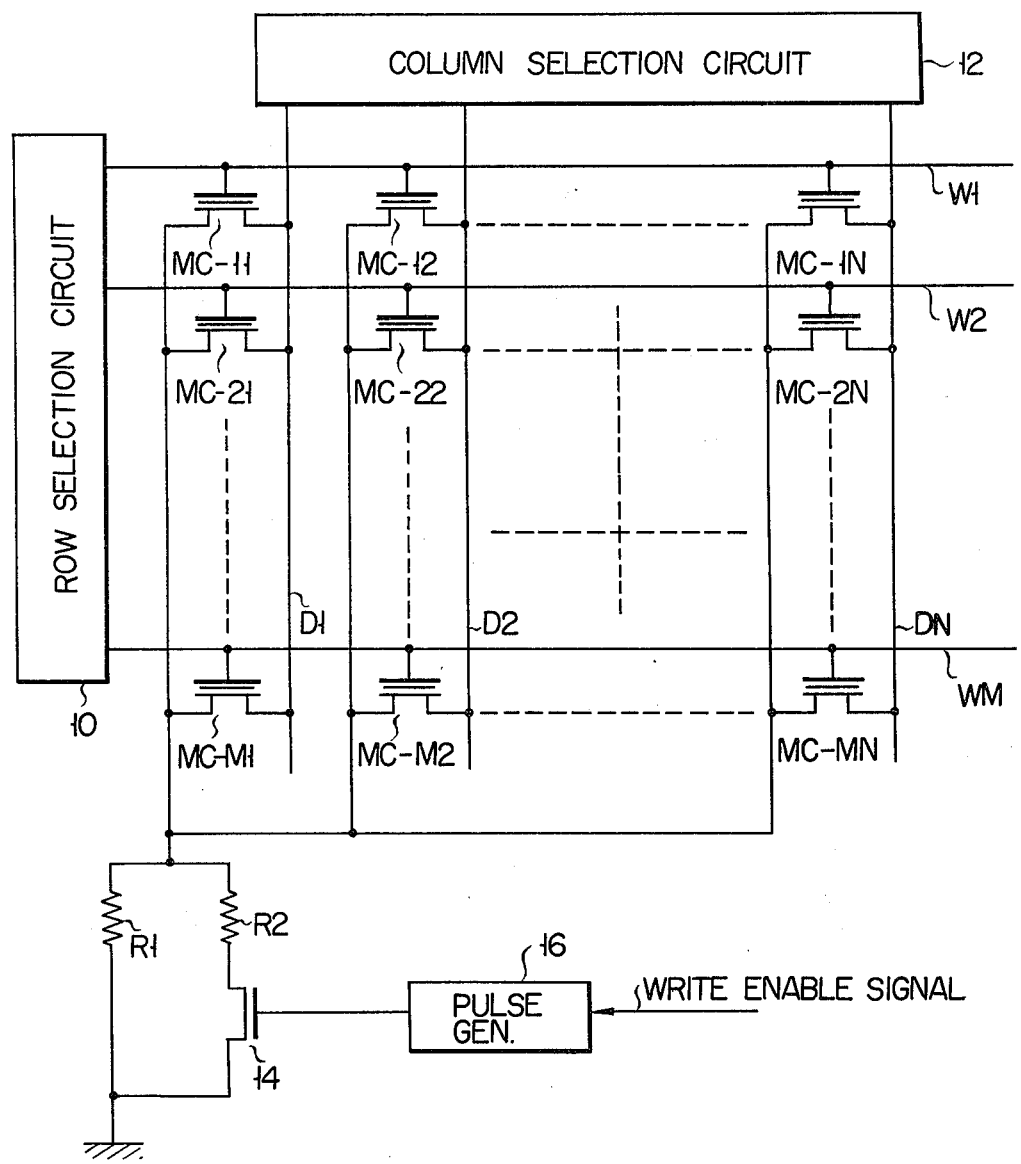

NONVOLATILE SEMICONDUCTOR MEMORY DEVICE

This invention relates to a nonvolatile semiconductor memory device formed of metal-oxide-semiconductor field effect transistors.

In an N-channel metal-oxide-semiconductor field effect transistor (hereinafter referred to as MOS FET), for example, it is generally known that breakdown is caused by a lower drain voltage in a situation that a positive gate voltage is applied to cause channel current to flow than in a situation that the gate voltage is 0 V and no channel current flows. If the gate voltage is raised to some degree while the channel current is flowing, a pinch-off region will be formed in a position adjacent to the drain region, and a great number of electron-hole pairs will be produced within the pinch-off region by impact ionization. Part of the holes in the electron-hole pairs flow into substrate to increase the substrate potential. As a result, a parasitic bipolar transistor formed of the drain, source and substrate is rendered conductive, and the MOS FET is equivalently led into breakdown. Such bipolar transistor action can be said to have been induced by the lowest drain voltage when the hole current flowing into substrate is at its maximum. For the bipolar transistor action, refer to "Breakdown mechanism in short-chanel MOS transistor" by E. Sun et al. on pp. 478–482 of 1978 edition of IEDM.

With a memory cell formed of an MOS FET having a floating gate, a writing operation is executed by injecting the floating gate with electrons produced from the electron-hole pairs by impact ionization. In this case, as mentioned before, the holes produced by the impact ionization flow into the substrate to increase the potential thereat, exerting a bad influence upon transistor circuits forming a decoder and other peripheral components around the memory cell, as well as upon the memory cell itself. In a writing mode, for example, a high voltage is supplied from the decoder circuit to the gate of the MOS FET of the memory cell by means of a gate control line. In this case, as aforesaid, the substrate potential increases, and a current is urged to flow into the source of the MOS FET of the memory cell by a bipolar transistor action caused between the MOS FET of the memory cell and an MOS FET of the decoder circuit, or by an increase of field leak current. As a result, the potential of the gate control line is lowered to prevent stable data writing.

Referring now to FIG. 1, the drawbacks of the prior art semiconductor memory device will further specifically be described. In FIG. 1, a depletion-type load MOS FET 1 and a driving MOS FET 2 are coupled in series between a power supply terminal $V_p$ and a ground terminal, and a floating-gate type MOS FET 3 forming a memory cell is coupled between a data terminal $V_D$ and the ground terminal. The gates of the MOS FET's 1 and 3 are both coupled to a junction between the MOS FET's 1 and 2, while the gate of the MOS FET 2 is coupled to a control voltage terminal $V_{CI}$. The semiconductor memory device shown in FIG. 1 further includes a depletion-type load MOS FET 4 and a driving MOS FET 5 coupled in the same manner as the MOS FET's 1 and 2, and a floatinggate type MOS FET 6 coupled in the same maner as the MOS FET 3. The gate of the MOS FET 5, however, is coupled to another control voltage terminal $V_{C2}$.

In supplying a high voltage to the gate of the MOS FET 3, a suitable control voltage is applied to the control voltage terminal $V_{CI}$ to bring the MOS FET 2 into the nonconducting state. As a result, a high voltage is applied to the gate of the MOS FET 3 via the MOS FET 1, and data is written in the MOS FET 3 in accordance with the level of a voltage supplied to the data terminal $V_D$.

In general, the MOS FET 1 is disposed in close vicinity to the MOS FET 3 forming the memory cell in consideration of the pattern layout of various semiconductor elements. Accordingly, when the substrate potential is increased in the data writing mode, a bipolar transistor action will be caused by the source regions of the MOS FET's 1 and 3 and the substrate region between these source regions to cause a current to flow from the source region of the MOS FET 1 to the source region of the MOS FET 3. In consequence, the gate voltage of the MOS FET 3 is lowered, and it becomes hard to write data in the memory cell formed of the MOS FET 3.

FIG. 2 is a schematic diagram of a semiconductor structure for illustrating the arrangements of the MOS FET's 1, 3 and 6 shown in FIG. 1. In this semiconductor structure, the MOS FET 1 includes a drain region D1 and a source region S1, the MOS FET3 includes a drain region D3 and a source region S3, and the MOS FET 6 includes a drain region D6 and a source region S6. Further, in this semiconductor structure, there is formed a parasitic MOS FET 7 including the semiconductor regions S1 and S3 as its source and drain regions, respectively.

FIG. 3 shows the relationship between the substrate potential $V_S$ and an current $I_S$ caused by the bipolar transistor action to flow into the parasitic MOS FET 7 including the semiconductor regions S1 and S3 in the semiconductor structure shown in FIG. 2. In FIG. 3, solid lines SL1 and SL2 are characteristic curves representing cases where the gate voltage is set to 25 V and the drain voltage is set to 5 V and 25 V, respectively, while broken lines BL1 and BL2 are characteristic curves representing cases where the gate voltage is set to 0 V and the drain voltage is set to 5 V and 25 V, respectively.

As may be seen from the characteristic curves shown in FIG. 3, when the substrate potential becomes 0.6 V, for example, a current $I_S$ of approximately 15 $\mu$A will inevitably be caused to flow between the semiconductor regions S1 and S3 by the aforesaid bipolar transistor action even though the gate voltage $V_G$ is 0 V.

FIG. 4 shows the relationship between the threshold voltage $V_{TH}$ and substrate voltage $V_S$ of the parasitic MOS FET 7. As is evident from FIG. 4, the parasitic MOS FET 7, which has a threshold voltage of approximately 17 V in the normal state or when the substrate voltage $V_S$ is 0 V, will have a substantially reduced threshold voltage of 11 V when the substrate voltage $V_S$ becomes 0.4 V, for example. Thus, peripheral circuits will be greatly influenced by the variations of the substrate voltage $V_S$.

Further, since the substrate potential is increased and a high voltage is applied also to the drain of the MOS FET 6, a current is inevitably caused to flow from the drain D6 to the source S6 of the MOS FET 6. As a result, the potential at the power supply terminal $V_D$ is lowered to prevent power execution of writing operation.

FIGS. 5 to 7 are schematic structural diagrams of the MOS FET for illustrating the impossibility of writing due to a potential drop of a data line in writing data into a memory cell formed of an MOS FET with a floating gate. FIG. 5 is a plan view of the MOS FET, FIG. 6 is a sectional view of the semiconductor structure as taken along line VI—VI of FIG. 5, and FIG. 7 is a sectional view of the semiconductor structure as taken along line VII—VII of FIG. 5.

As shown in FIGS. 5 to 7, the MOS FET includes a source region SR and a drain region DR formed in the surface region of a substrate SB, an isolation layer IL stretching over these two regions SR and DR, a floating gate FG formed within the isolation layer IL, a control gate CG formed over the floating gate FG, and a word line WL formed as a unit with the control gate CG. Now let us suppose that parasitic capacitances formed between the floating gate FG and respective one of the control gate CG, channel region, source region SR, drain region DR and substrate surface are C1, C2, C3, C4 and C5, respectively.

In this case, if the drain voltage and control gate voltage are $V_D$ and 0 V, respectively, potential $V_F$ at the floating gate FG may be given by $$V_F = \frac{C4}{C1 + C2 + C3 + C4 + C5} \cdot V_D \quad (1)$$

Now let it be supposed that the thickness of the insulation layer conducive to the formation of the parasitic capacitances C1 to C4, i.e. the distance between the floating gate FG and the channel region of the substrate SB in FIG. 7, is 1,000 Å, and that the thickness of the isolation layer conductive to the formation of the parasitic capacitance C5, i.e. the distance between the floating gate FG and the field region of the substrate SB as clearly shown in FIG. 7, is 7,000 Å. Further, the width of the floating gate FG is three times as large as the channel width, the length of the floating gate FG is 4μ, and the distances of extension of the drain and source regions DR and SR into a region right under the floating gate FG is 1μ. In this case, if the parasitic capacitances C3 and C4 depend on the distances of extension of the regions DR and SR into the region right under the floating gate FG, respectively, equation (1) may be rewritten as follows:

$$V_F = \frac{\frac{1}{1,000} \times V_D}{\frac{3 \times 4 + 2 + 1 + 1}{1,000} + \frac{2 \times 4}{7,000}} = 0.058 V_D$$

Then, if $V_D = 20$ V is given, we obtain $V_F = 1.16$ V. Thus, in the writing operation, the potential at the floating gate of the MOS FET of a nonselected memory cell is charged with 1.16 V by only applying a voltage of 20 V to the drain of the MOS FET. Accordingly, the threshold voltage of the MOS FET need be set to 1.16 V or above. If the threshold voltage is raised, however, the current flowing into the memory cell is reduced in reading out data from the memory cell, so that charging and discharge of the data line require a long time, lowering the reading speed. Conventionally, therefore, the threshold voltage is lowered to such a degree that a leakage current within a negligible range may flow also into a nonselected memory cell in the writing operation. Recently, however, large-capacity memories have come to be widely used, so that leakage currents flowing through one and the same data line have become significant. Namely, the existence of the leakage currents lowers the potential of a selected data line at writing operation to affect such writing operation.

In constructing a large-capacity memory, moreover, MOS FET's are formed so as to have short channel length, thereby causing a short-channel effect. Namely, when a high voltage is applied to the drains of MOS FET's of memory cells arranged on the same column with the selected memory in the writing operation, a current is inevitably caused to flow between the drains and sources of these MOS FET's by a punch-through phenomenon. As a result, the drain voltage is lowered to prevent secure execution of the writing operation.

The object of this invention is to provide a nonvolatile semiconductor memory device capable of high-reliability operation.

According to an embodient of this invention, there is provided a nonvolatile semiconductor memory device wich comprises at least one memory cell including an MOS transistor with a floating gate, at least one word line coupled to the gate of the MOS transistor of the memory cell and selectively transmitting an access signal to the memory cell, at least one data line coupled to the drain of the MOS transistor of the memory cell and transmitting data to be transferred to and from the memory cell, and a potential level control means coupled to the source of the MOS transistor of the memory cell and maintaining the source potential of the MOS transistor substantially at a given level.

This invention can be more fully understood from the following detailed description when taken in conjunctin with the accompanying drawings, in which:

FIG. 8 is a circuit diagram of a semiconductor memory device according to an embodiment of this invention;

FIG. 10 is a circuit diagram of a semiconductor memory device according to another embodiment of the invention;

Figure 1:
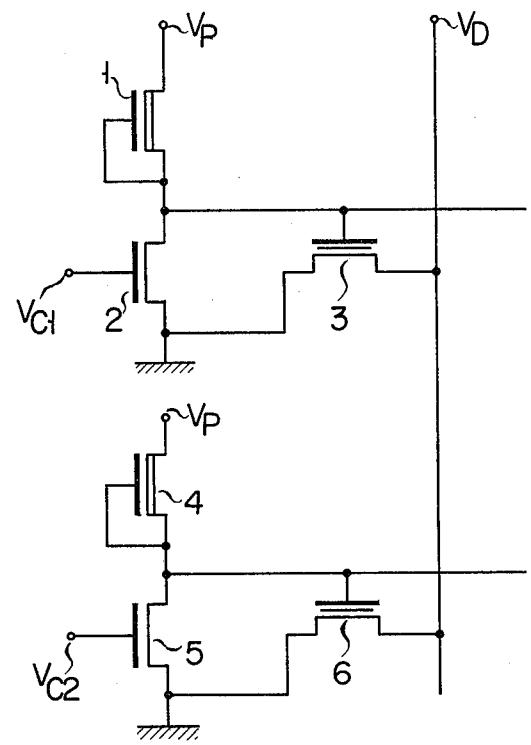
FIG. 1 is a connection diagram showing prior art memory cells and decoder circuits.
Figure 2:
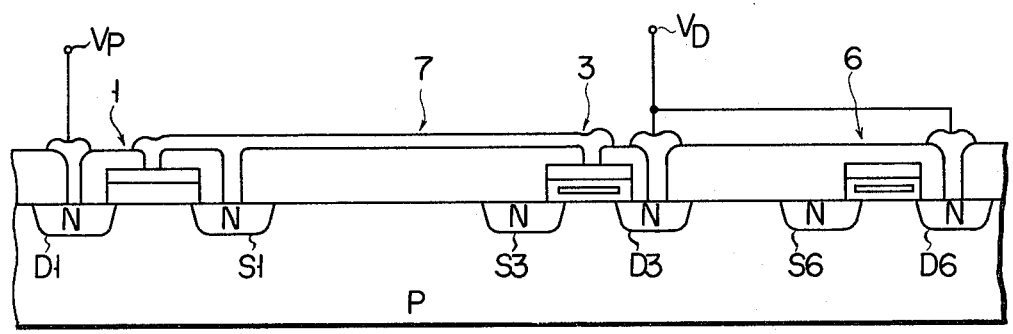
FIG. 2 is a diagram for illustrating the structure of part of the circuit elements forming the circuits shown in FIG. 1.
Figure 3:
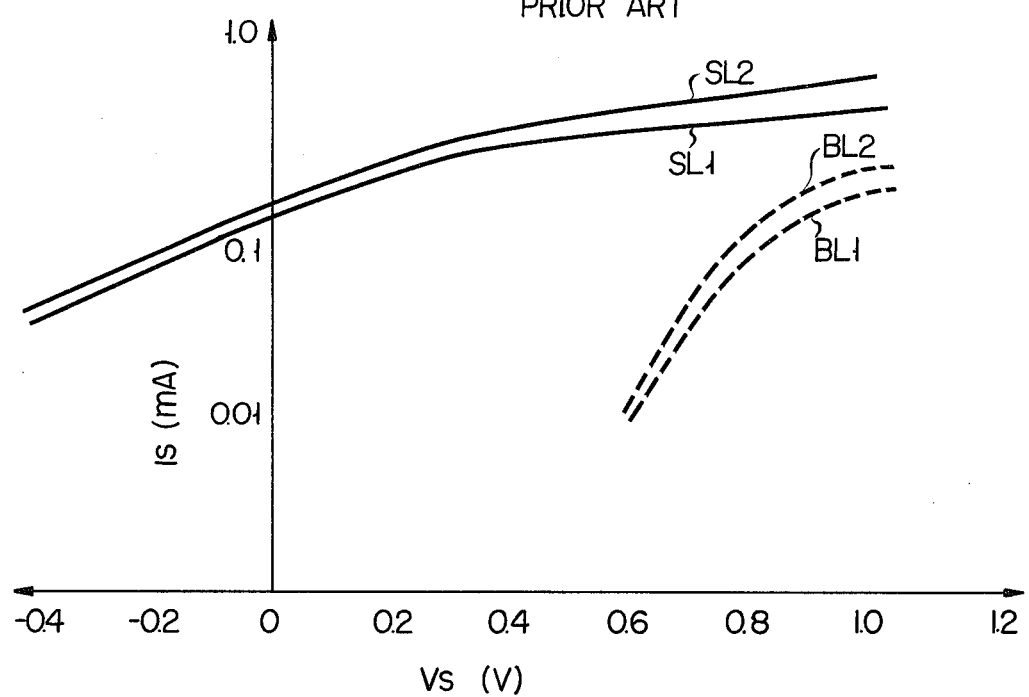
FIG. 3 shows characteristic curves for illustrating the relationship between the substrate potential and currents flowing between the elements in the semiconductor structure shown in FIG. 2.
Figure 4:
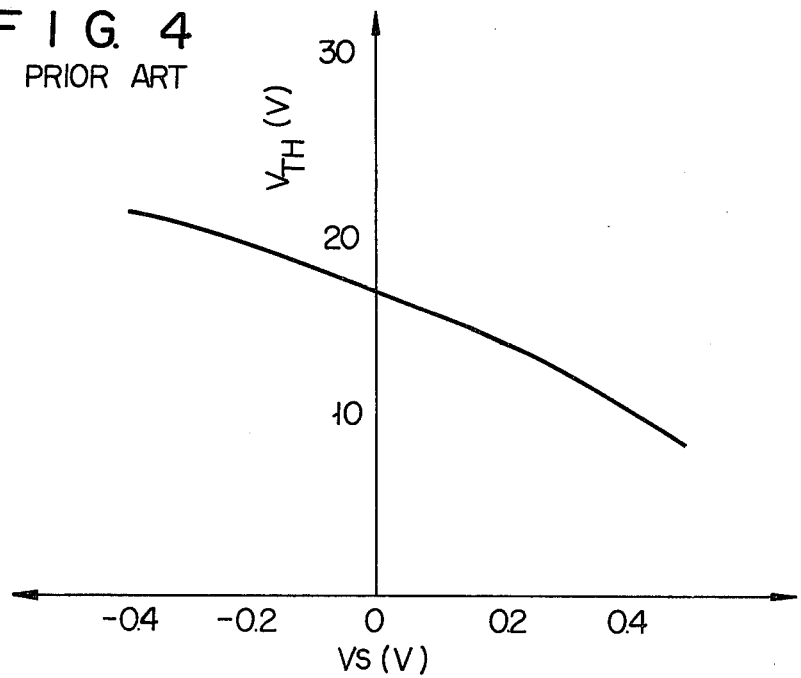
FIG. 4 shows a characteristic curve for illustrating the relationship between the substrate potential and the threshold voltage of a parasitic MOS FET in the semiconductor structure shown in FIG. 2.
Figure 5:
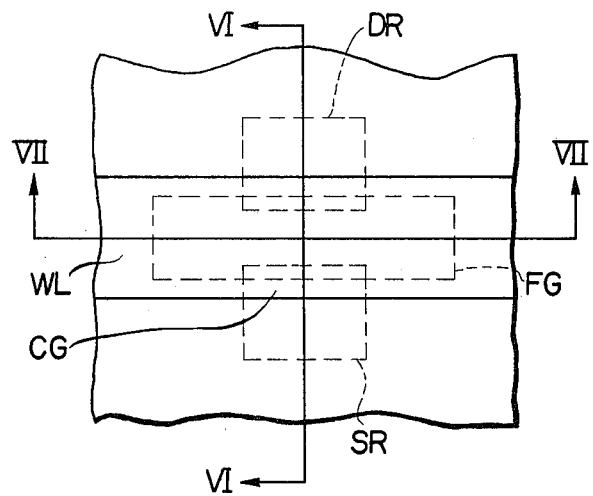
FIGS. 5 to 7 are structural diagrams of an MOS FET used in a prior art semiconductor memory device for illustrating the influence of a floating gate on the MOS FET.
Figure 6:
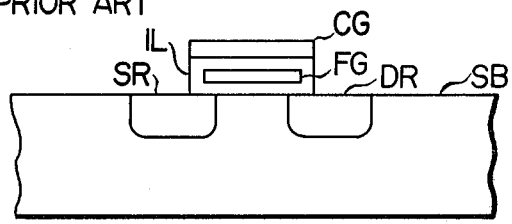
Figure 7:
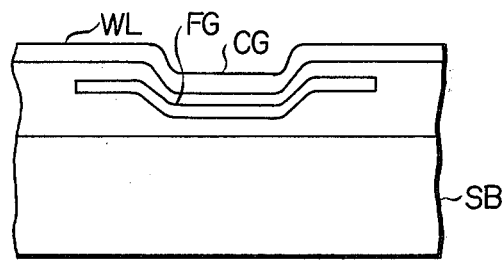

FIG. 8 shows a nonvolatile semiconductor memory device according to an embodiment of this invention. The memory device comprises a plurality of memory cells MC-11 to MC-MN arranged in the form of a matrix, each of the memory cells being formed of an MOS transistor with a floating gate, word lines W1 to WM each coupled in common with the control gates of the MOS transistors forming memory cells on the same row, data lines D1 to DN each coupled in common with the drains of MOS transistors forming memory cells on the same column, and a resistor R1 coupled in common with the sources of the MOS transistors forming the memory cells MC-11 to MC-MN. Further, the memory device is provided with a row selection circuit 10 selecting the wordlines W1 to WM in response to an address signal from an address signal generation circuit (not shown), and a column selection circuit 12 selecting one of the data lines D1 to DN in response to the address signal and enabling data to be transferred between a selected memory cell and an external circuit (not shown).

Now let us suppose a case where data is written in the memory cell MC-11, for example. In this case, the word line W1 is selected by an address designation signal from the row selection circuit 10, and the column line D1 is selected by an address designation signal from the column selection circuit 12. As a result, a writing current flows between the drain and source of the MOS transistor forming the memory cell MC-11. Electrons, for example, out of electron-hole pairs produced by the writing current are trapped by the floating gate of the MOS transistor, and data is written in the memory cell MC-11. Meanwhile, since the writing current flows via the resistor R1, the source potential of the MOS transistor rises. Although, at the same time, the substrate potential of the MOS transistor also rises, the aforementioned bipolar transistor action or punch-through phenomenon due to a substrate potential rise will never be caused if the resistance value of the resistor R1 is so set that a source potential build-up rate higher than the substrate potential build-up rate may be obtained. Furthermore, the source potential is kept higher than the substrate potential, so that the data writing in the memory cell MC-11 may securely be executed without causing any currents to flow from peripheral circuits into the source of the MOS transistor forming the memory cell MC-11, and hence without lowering the potential of the word line W1. Moreover, the existence of the resistor R1 forces the source of the MOS transistor forming the memory cell into which the data is written to be maintained at a higher potential than the substrate. Therefore, peripheral circuits including the row and column selection circuits 10 and 12 can be arranged in close vicinity to the matrix array of memory cells MC-11 to MC-MN to reduce the chip size without causing the matrix array to exert any substantial electrical influences on the peripheral circuits such as row and column selection circuits 10 and 12. Since the source potential is set higher than the substrate potential, moreover, the punch-through phenomenon can be checked satisfactorily. In consequence, the channel length of the memory cell MOS FET can be reduced, so that the memory cells can be arranged with high density.

Figure 9:
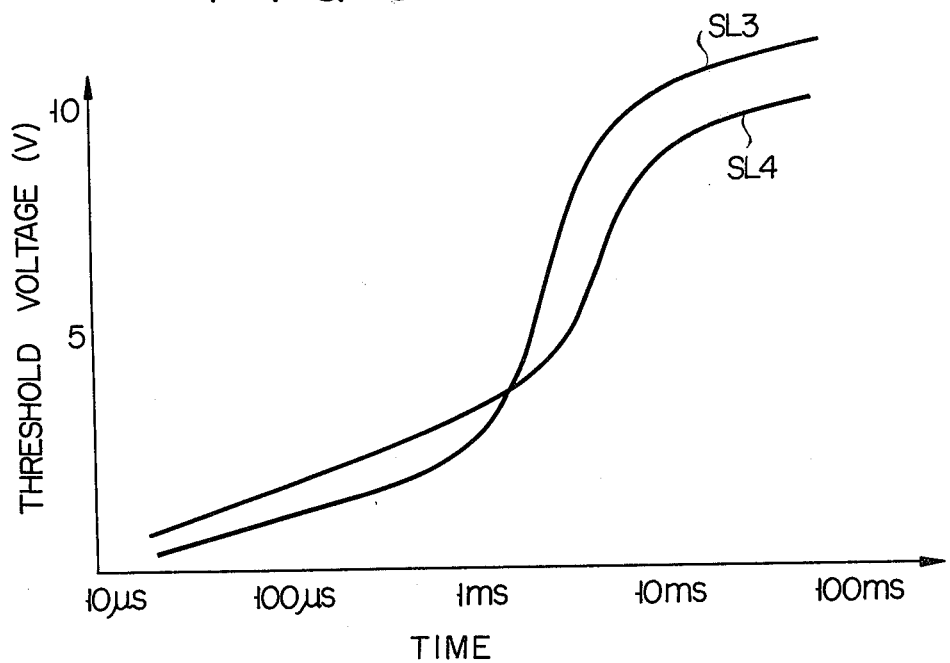
FIG. 9 shows characteristic curves for illustrating the relationship between the threshold voltage of an MOS FET forming a memory cell selected for data writing and the writing time.

In the writing operation with the semiconductor memory circuit shown in FIG. 8, the threshold voltage $V_{TH}$ of the MOS FET forming the selected memory cell increases as electrons are injected into the floating gate of the MOS FET, that is, with the passage of the writing time. The relationship between the threshold voltage $V_{TH}$ and the writing time is shown in FIG. 9. In FIG. 9, solid lines SL3 and LS4 are characteristic curves obtained when the resistance of the resistor R1 is set at great and small values, respectively. For example, if the resistor R1 has a great value and is so set as to provide a voltage drop of 0.7 V to 1.0 V thereacross, the threshold voltage $V_{TH}$ takes a small value at the initial stage of the writing, though it suddenly comes to take a large value after the writing time has passed 1 ms or thereabouts. On the other hand, if the resistor R1 has a small resistance value and is so set as to provide a voltage drop of 0.4 V to 0.5 V thereacross, the threshold voltage takes a greater value as compared with the foregoing case at the initial stage of the writing, though it comes to take a smaller value than the value in the aforesaid case after the writing time has passed 2 ms or thereabouts. As may be seen from the characteristic curves of FIG. 9, it is advisable to increase and decrease the resistance value of the resistor R1 at the initial stage of the writing and after the passage of a given time, respectively, in order to write the data in the memory cell at high speed.

FIG. 10 shows a semiconductor memory circuit constructed in consideration of the relationship between the threshold voltage $V_{TH}$ and the writing time. This semiconductor memory circuit is substantially the same as the one shown in FIG. 8, except that it further includes a series circuit including a resistor R2 and an MOS FET 14 and coupled in parallel with the resistor R1 and a pulse generator 16 to control the conduction state of the MOS FET 14 in response to a write enable signal.

In the writing operation with the circuit shown in FIG. 10, the pulse generator 16 applies a control signal of e.g. high level to the gate of the MOS FET 14 in response to the write enable signal from an external control circuit (not shown) through the initial period of the writing operation, thereby causing the MOS FET 14 to conduct. As a result, the value of resistance existing between the sources of the MOS FET's forming the memory cells MC-11 to MC-MN and the ground is reduced, and the source potentials of these MOS FET's are set between 0.4 V and 0.5 V, for example. Namely, in this case, the threshold voltage of the MOS FET forming the selected memory cell increases with the passage of the writing time along the curve SL4 of FIG. 9. When a given writing time has passed, a low-level control signal is produced from the pulse generator 16 to turn off the MOS FET 14. The source potentials of the MOS FET's forming the memory cells MC-11 to MC-MN are set between 0.7 V and 1.0 V, for example. Namely, the threshold voltage of the MOS FET forming the selected memory cell increases with the passage of the writing time at a rate corresponding to the inclination of the curve SL3 of FIG. 9.

Thus, a high-efficiency writing operation can be achieved by changing the resistance of the resistor coupled with the sources of the MOS FET's forming the memory cells from a small value to a great value during the period for such writing operation.

Figure 11:
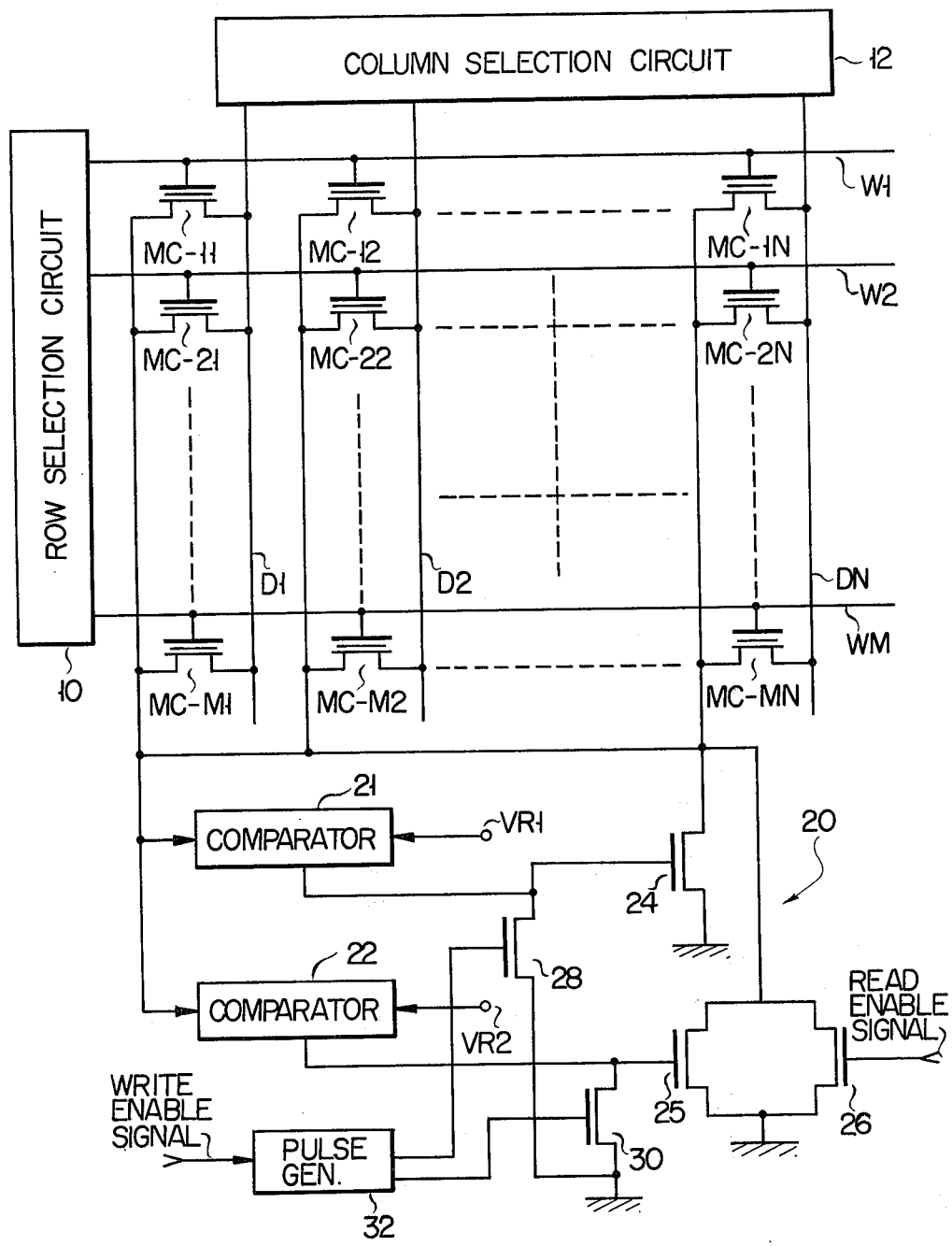
FIG. 11 is a circuit diagram of a semiconductor memory device according to still another embodiment of the invention.

FIG. 11 shows a semiconductor memory circuit according to another embodiment of this invention having a source potential control circuit 20 which is constructed so as to provide substantially the same effect as the circuit of FIG. 10. The source potential control circuit 20 comprises comparators 21 and 22 whose first input terminals are coupled to the sources of the MOS FET's forming the memory cells MC-11 to MC-MN, MOS transistors 24, 25 and 26 whose current paths are coupled between the sources of the MOS FET's and the ground, MOS transistors 28 and 30 having current paths coupled respectively between the comparators 21 and 22 and the ground, and a pulse generator 32 supplying a low-level signal to the gate of the MOS transistor 28 in response to a write enable signal from an external control circuit (not shown) for a given time after the start of the writing operation and supplying the low-level signal to the gate of the MOS transistor 30 for the remaining writing time. The comparator 21 receives a reference voltage VR1 of e.g. 0.5 V at its second input terminal, and has an output terminal coupled to the gate of the MOS transistor 24. As for the comparator 22, it receives a reference voltage VR2 of e.g. 0.9 V at its second input terminal, and has an output terminal coupled to the gate of the MOS transistor 25. The MOS transistor 26 is caused to conduct in response to a read enable signal from the external control circuit during a period of reading operation, and is kept in the nonconductive state during the writing operation period.

When the source potential of the MOS FET forming the selected memory cell increases to reach 0.5 V or higher in the writing operation of the semiconductor memory circuit shown in FIG. 11, a high-level signal is produced from the comparator 21. Since the MOS transistor 28 is kept nonconductive by the low-level signal from the pulse generator 32, the high-level signal from the comparator 21 is applied to the gate of the MOS transistor 24, thereby rendering the MOS transistor 24 conductive. Consequently, the source potential of the selected MOS FET is lowered through the MOS transistor 24. When the source potential falls below 0.5 V, an output signal from the comparator 21 is reduced to low level to turn off the MOS transistor 24. Thus, the source potential of the selected MOS FET is to be kept at approximately 0.5 V during the initial writing period.

When the initial writing period has passed, the MOS transistor 28 is turned on by control signals from the pulse generator 32, the MOS transistor 24 is set and maintained in the nonconductive state, and the MOS transistor 30 is rendered nonconductive. The comparator 22 operates in the same manner as the comparator 21, thereby keeping the source potential of the selected MOS FET at approximately 0.9 V.

Thus, the source potential of the MOS FET forming the selected memory cell is kept at approximately 0.5 V during the initial writing period, and at approximately 0.9 V during the subsequent writing period in the same write-in operation, so that the same effect as described in connection with FIG. 10 may be obtained with use of this semiconductor memory circuit.

Figure 12:
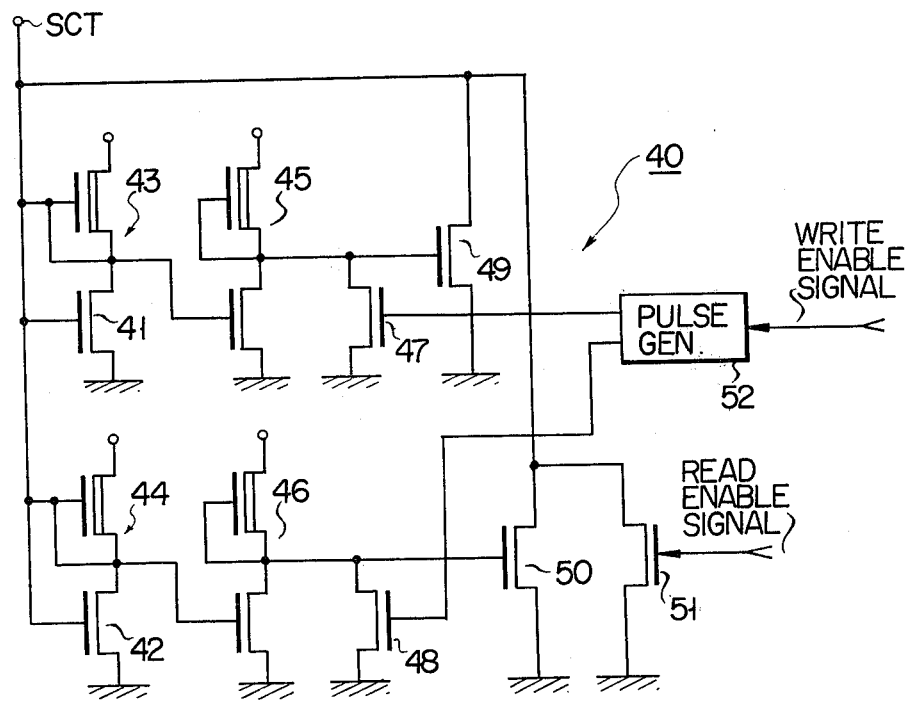
FIG. 12 is a modification of a control circuit used with the semiconductor memory device shown in FIG. 11.

FIG. 12 shows a source potential control circuit 40 having the same function with the source control circuit 20 shown in FIG. 11. The control circuit 40 comprises inverters 43 and 44 respectively including MOS transistors 41 and 42 having threshold voltages of e.g. 0.1 V and 0.5 V, respectively, and whose gates are coupled to a source coupling terminal SCT, inverters 45 and 46 whose input terminals are coupled respectively to the inverters 43 and 44, MOS transistors 47 and 48 coupled between the respective output terminals of the inverters 45 and 46 and the ground, and MOS transistors 49, 50 and 51 whose current paths are coupled between the source coupling terminal SCT and the ground. The gates of the MOS transistors 49 and 50 are coupled respectively to the output terminals of the inverters 45 and 46, and the gates of the MOS transistors 47 and 48 are coupled to first and second output terminals of a pulse generator 52 which produces control signals in response to a write enable signal from an external control circuit (not shown). Further, the MOS transistor 51 is caused to conduct in response to a read enable signal from the external control circuit in the read-out operation, and is kept in the nonconductive state in the write-in operation.

When the source potential of the MOS FET forming the selected memory cell increases to reach approximately 0.5 V in the writing operation mode, the MOS transistor 41 is turned on to cause an output voltage from the inverter 43 to decrease. As a result, an output signal from the inverter 45 increases. In this case, since a low-level signal is supplied from the pulse generator 52 to the gate of the MOS transistor 47, the MOS transistor 47 is kept in the nonconductive state. Accordingly, the MOS transistor 49 is rendered conductive by the high-level signal from the inverter 45, thereby lowering the potential at the source coupling terminal SCT. When the potential at the source coupling terminal SCT is lowered to some degree, the resistance of the MOS transistor 41 becomes large, causing the output voltage of the inverter 43 to increase. As a result, the output voltage of the inverter 45 decreases, causing the resistance of the MOS transistor 49 to become high and the potential at the source coupling terminal SCT to rise again. That is, in the initial writing period, the potential at the source coupling terminal SCT is maintained at about 0.5 V. After the elapse of the initial writing time, the MOS transistor 47 is rendered conductive in response to a control signal from the pulse generator 52 and the MOS transistor 48 is rendered nonconductive. In the remaining time of the writing period, the inverters 44 and 46 and the MOS transistor 50 function in the same manner as the inverters 43 and 45 and the MOS transistor 49, respectively to maintain the source coupling terminal SCT at about 0.9 V.

Thus, the control circuit 40 shown in FIG. 12 operates to maintain at about 0.5 V the source potential of MOS FET forming a memory cell selected in the initial writing period and maintain the same at about 0.9 V after the elapse of the initial writing time. That is, the control circuit 40 functions to provide substantially the same effect as the control circuit 20 shown in FIG. 11.

Figure 13:
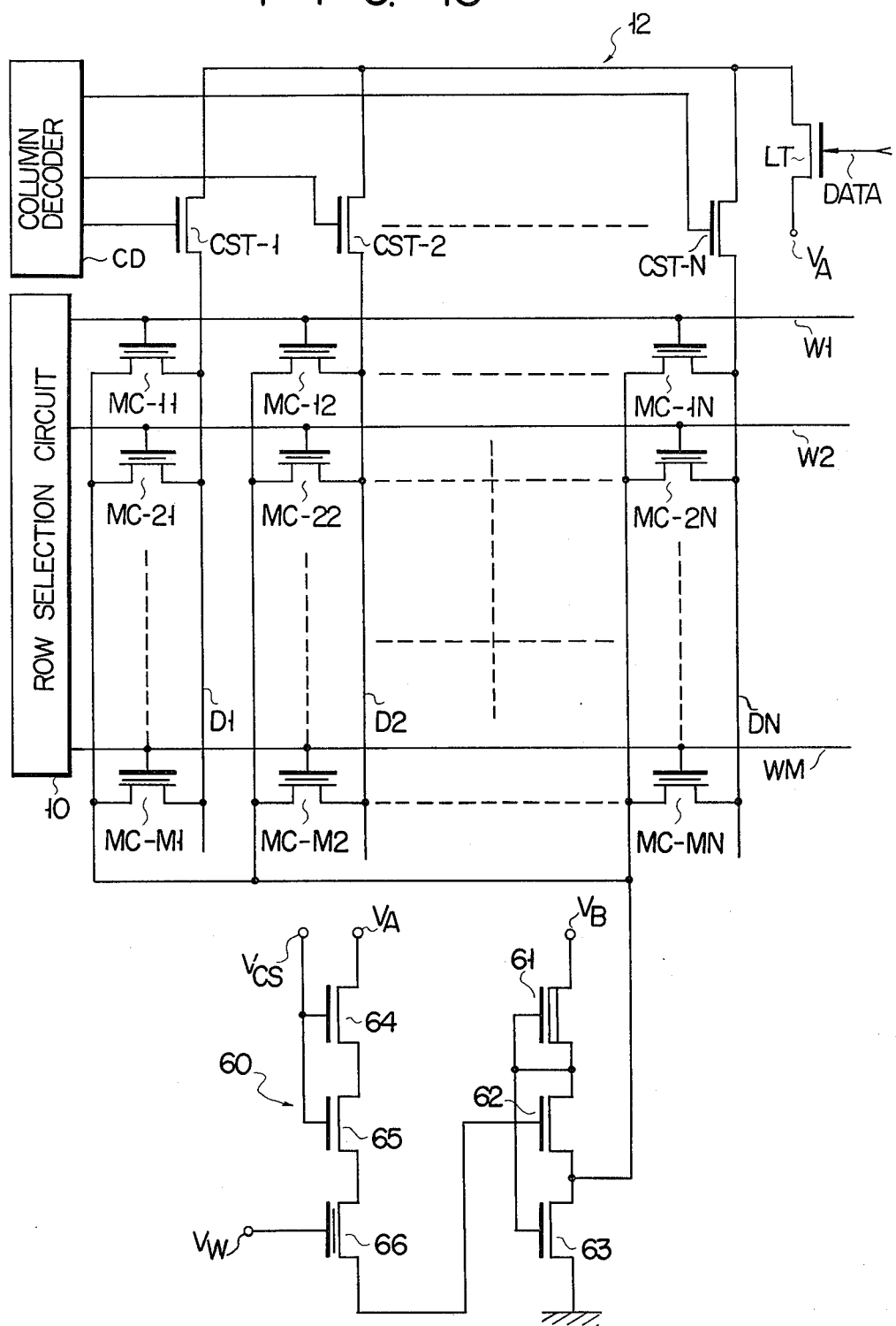
FIG. 13 is a circuit diagram of a semiconductor memory device according to a further embodiment of the invention.

FIG. 13 shows a semiconductor memory circuit according to a further embodiment of this invention. A column selection circuit 12 in this semiconductor memory circuit includes MOS transistors CST-1 to CST-N whose current paths are coupled respectively to data lines D1 to DN, a load MOS transistor LT having a current path coupled between the MOS transistors CST-1 to CST-N and a power supply terminal $V_A$ and controlled for conduction state in accordance with write-in data, e.g. so designed as to be turned on in response to data "1", and a column decoder CD to render one of the MOS transistors CST-1 to CST-N conductive in response to an address signal from an external control circuit (not shown).

Moreover, a source potential control circuit 60 is coupled to the sources of the MOS FET's forming memory cells MC-11 to MC-MN. The control circuit 60 includes a depletion-type MOS transistor 61, an MOS transistor 62 with a threshold voltage of approximately 0 V, and an MOS transistor 63, the current paths of all these transistors being coupled in series between a power supply terminal $V_B$ and the ground. A junction between the MOS transistors 61 and 62 is coupled to the gates of the MOS transistors 61 and 63, and a junction between the MOS transistors 62 and 63 is coupled to the sources of the MOS FET's forming the memory cells. Further, the control circuit 60 includes MOS transistors 64, 65 and 66 whose current paths are coupled in series between the power supply terminal $V_A$ and the gate of the transistor 62. The MOS transistor 64 is constructed in the same manner as the load transistor LT, the MOS transistor 65 as each of the MOS transistors CST-1 to CST-N and the MOS transistor 66 as the MOS FET forming each of the memory cells MC-11 to MC-MN. The gates of the MOS transistors 64 and 65 are coupled with a control signal terminal $V_{CS}$ to receive control signals in the writing operation mode, while the gate of the MOS transistor 66 is supplied with a voltage at the same level as the potential of nonselected word lines in the writing operation mode. Namely, a voltage $V_A$ is applied to the drain of the MOS transistor 66 through the MOS transistors 64 and 65 in the writing operation, and the source potential of the MOS transistor 66 is maintained at a given level by the punch-through phenomenon, etc.

In writing data "0" into a selected memory cell in the writing operation mode, the data lines D1 to DN are kept at low-level potential, so that the source potential $V_{SP}$ of the MOS FET's forming the memory cells is low, and the MOS transistors 62 and 63 are maintained slightly conductive, and the source potential $V_{SP}$ is settled at a given level.

In writing data "1" into the selected memory cell, on the other hand, a current flows through the selected memory cell and the source potential of the MOS FET forming the selected memory cell increases, so that the source potential $V_{SP}$ becomes higher than the source potential of the MOS transistor 66, i.e. the gate voltage of the MOS transistor 62, thereby turning off the MOS transistor 62. As a result, the gate voltage of the MOS transistor 63 suddenly increases to reduce the conduction resistance of the MOS transistor 63 by a large margin, thus compulsorily lowering the source potential $V_{SP}$. When the source potential $V_{SP}$ falls below the gate voltage of the MOS transistor 62, the MOS transistor 62 is rendered conductive, thereby reducing the gate voltage of the MOS transistor 63 and increasing the conduction resistance of the MOS transistor 63. In consequence, the source potential $V_{SP}$ increases again. Such an operation is instantaneously effected and the source potential $V_{SP}$ is to be maintained at a constant level corresponding to the source potential of the MOS transistor 66.

Figure 14:
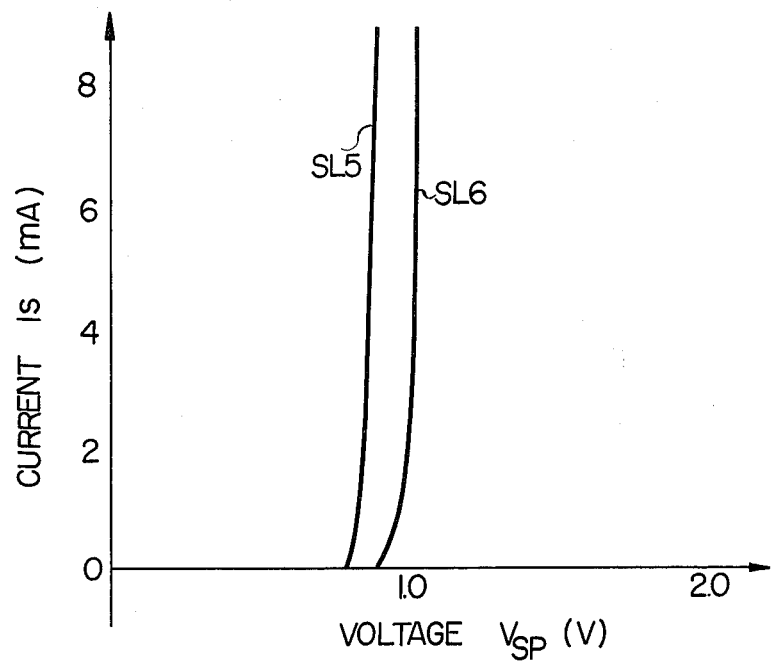
FIG. 14 shows characteristic curves for illustrating the relationship between the source potential of MOS FET's forming memory cells and a current flowing from the memory cells into the control circuit.

FIG. 14 shows the relationship between the source potential $V_{SP}$ of the MOS FET's forming the memory cells MC-11 to MC-MN and a current $I_s$ flowing from these memory cells MC-11 to MC-MN into the MOS transistor 63 in the writing operation mode. In FIG. 14, a solid line SL5 represents a case where the source potential of the MOS transistor 66 is 0.7 V with $V_W=0.1$ V,, while a solid line SL6 represents a case where the source potential of the MOS transistor 66 is 0.9 V with $V_W=0.3$ V. As is evident from the voltage-current characteristics shown in FIG. 14, the source potential $V_{SP}$ varies only about 0.06 V when the current $I_s$ varies from 1 mA to 10 mA. Since the current flowing into a single memory cell is 1 mA to 2 mA, usually, the source potential of MOS FET's forming memory cells used in a memory for storing e.g. 4-bit data can be kept at a substantially constant level by using the control circuit 60 with the memory.

Figure 15:
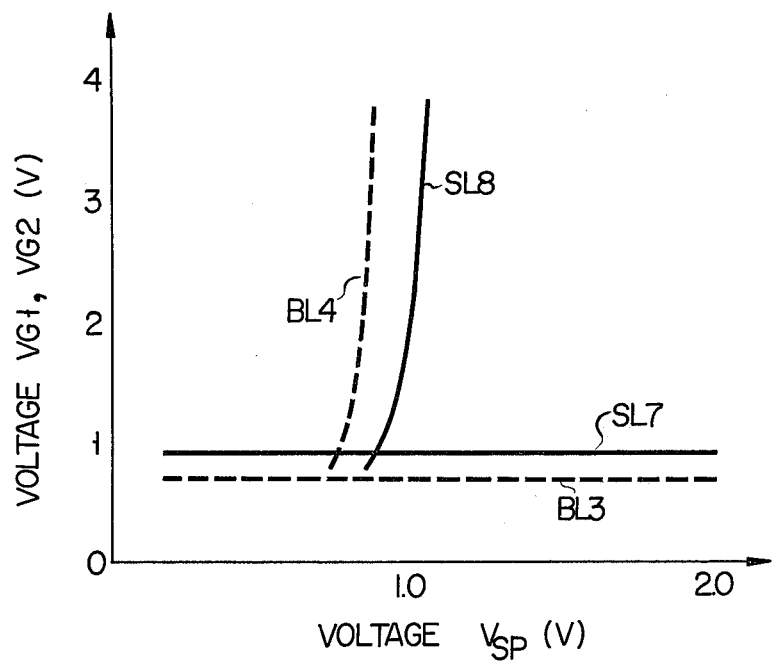
FIG. 15 shows characteristic curves for illustrating the relationship between the source potential of the MOS FET's forming the memory cells and the gate voltages of two MOS transistors used in the control circuit.

FIG. 15 shows the relationship between the source potential $V_{SP}$ and the gate voltages $V_{G1}$ $V_{G2}$ of the MOS transistors 62 and 63. In FIG. 15, a solid line SL7 and a broken line BL3 represent $V_{SP}-V_{G1}$ characteristics with $V_W=0.3$ V and 0.1 V, respectively, and a solid line SL8 and a broken line BL4 represent $V_{SP}-V_{G2}$ characteristics with $V_W=0.3$ V and 0.1 V, respectively. As is evident from the voltage characteristics shown in FIG. 15, the gate voltage $V_{G1}$ of the MOS transistor 62 is kept substantially constant irrespective of the variation of the source potential $V_{SP}$, whereas the gate voltage $V_{G2}$ of the MOS transistor 63 increases drastically when the source potential $V_{SP}$ rises above approximately 0.8 V to 1.0 V. Thus, the source potential $V_{SP}$ can be maintained between 0.8 V and 1.0 V.

Figure 16:
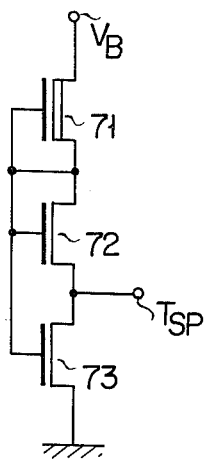
FIGS. 16 to 18 show modifications of the control circuit used with the semiconductor memory device of FIG. 13.
Figure 17:
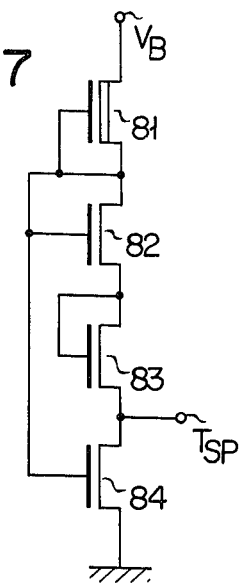

FIGS. 16 and 17 both show modified examples of the source potential control circuit 60 shown in FIG. 13. The control circuit shown in FIG. 16 includes a depletion-type MOS transistor 71, an MOS transistor 72 with a low threshold voltage, and an MOS transistor 73 with a higher threshold voltage than that of the MOS transistor 72 connected in series between the power supply terminal $V_B$ and the ground. A junction between the MOS transistors 71 and 72 is coupled to the gates of the MOS transistors 71 to 73, and a junction between the MOS transistors 72 and 73 is coupled to a source potential terminal $T_{SP}$ which is coupled to the sources of the MOS FET's forming the memory cells MC-11 to MC-MN.

At the start of a writing operation, a given voltage is applied to the gates of the MOS transistors 72 and 73 via the MOS transistor 71, and the MOS transistors 72 and 73 are maintained in the slightly conductive state. As stated before, when the potential at the source potential terminal $T_{SP}$ increases to become equal to the gate voltage of the MOS transistor 72, the MOS transistor 72 is turned off. Accordingly, the gate voltage of the MOS transistor 73 drastically increases to reduce the conduction resistance of the MOS transistor 73 by a great margin. As a result, the potential at the source potential terminal $T_{SP}$ is lowered and maintained at a given level.

The control circuit shown in FIG. 17 includes a depletion-type MOS transistor 81 and MOS transistors 82, 83 and 84 coupled in series between the power supply terminal $V_B$ and the ground. A junction between the MOS transistors 81 and 82 is coupled to the gates of the MOS transistors 81, 82 and 84, a junction between the MOS transistors 82 and 83 is coupled to the gate of the MOS transistor 83, and a junction between the MOS transistors 83 and 84 is coupled to the source potential terminal $T_{SP}$.

The control circuit of FIG. 17 operates in the same manner as the circuit shown in FIG. 16. Namely, when the potential at the source potential terminal $T_{SP}$ increases, the MOS transistor 82 is turned off, so that the gate voltage of the MOS transistor 84 drastically increases to reduce the conduction resistance of the MOS transistor 84, thereby lowering the potential at the source potential terminal $T_{SP}$.

Figure 18:
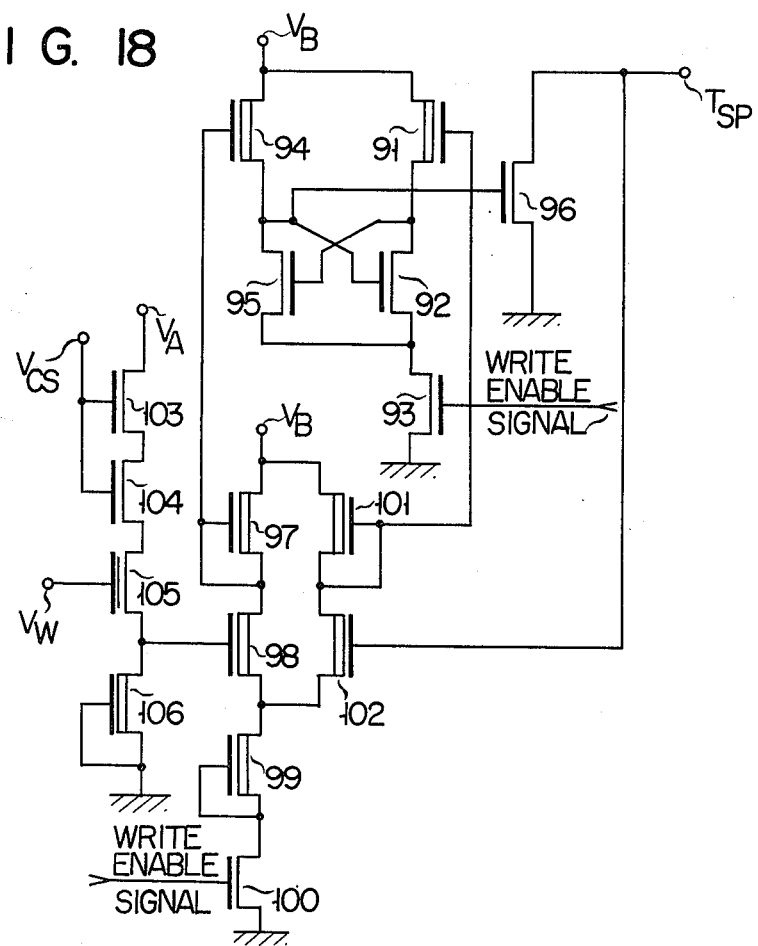

FIG. 18 shows still another modified example of the control circuit shown in FIG. 13. This control circuit includes a depletion-type MOS transistor 91 and MOS transistors 92 and 93 having current paths coupled in series between the power supply terminal $V_B$ and the ground, a depletion-type MOS transistor 94 and an MOS transistor 95 having current paths coupled in series between the power supply terminal $V_B$ and the MOS transistor 93, and an MOS transistor 96 having a current path coupled between the source potential terminal $T_{SP}$ and the ground. The gate of the MOS transistor 95 is coupled to a junction between the MOS transistors 91 and 92, and the gates of the MOS transistors 92 and 96 are coupled to a junction between the MOS transistors 94 and 95. Further, the control circuit of FIG. 18 includes a depletion-type MOS transistors 97, 98 and 99 and an MOS transistor 100 having current paths coupled in series between the power supply terminal $V_B$ and the ground, and depletion-type MOS transistors 101 and 102 having current paths coupled in series between the power supply terminal $V_B$ and the MOS transistor 99. A junction between the MOS transistors 97 and 98 is coupled to the gates of the MOS transistors 94 and 97, and a junction between the MOS transistors 101 and 102 is coupled to the gates of the MOS transistors 91 and 101. Moreover, the gate of the MOS transistor 102 is coupled to the source potential terminal $T_{SP}$, a junction between the MOS transistors 99 and 100 is coupled to the gate of the MOS transistor 99, and the gate of the MOS transistor 100 is supplied with a write enable signal. Furthermore, the control circuit includes MOS transistors 103 and 104 having current paths coupled in series between the power supply terminal $V_A$ and the ground, an MOS FET 105 with the same construction as the MOS FET's forming the memory cells MC-11 to MC-MN, and a depletion-type MOS transistor 106. A junction between the MOS FET 105 and the MOS transistor 106 is coupled to the gate of the MOS transistor 98, the gates of the MOS transistors 103 and 104 are coupled to the control signal terminal $V_{CS}$, and the gate of the MOS transistor 106 is grounded. The MOS transistors 103 and 104 are constructed in the same manner as the MOS transistors LT and CST shown in FIG. 13, respectively, while the MOS FET 105 has the same construction as the MOS FET's forming the memory cells MC-11 to MC-MN.

In the writing operation, a control signal is applied to the control signal terminal $V_{CS}$, a voltage $V_A$ is applied to the drain of the MOS transistor 105 through the MOS transistors 103 and 104, a voltage at the same level as the potential of nonselected word lines is applied to the gate of the MOS transistor 105, and the source potential $V_{SC}$ of the MOS transistor 105 is kept at a constant level. In this case, moreover, the MOS transistors 93 and 100 are both rendered conductive in response to the write enable signal.

Where the source potential $V_{SP}$ of the MOS FET's forming the memory cells MC-11 to MC-MN is lower than the source potential $V_{SC}$, the conduction resistance of the MOS transistor 102 is greater than that of the MOS transistor 98, so that the gate voltage of the MOS transistor 91 is higher than that of the MOS transistor 94. Accordingly, the conduction resistance of the MOS transistor 91 is smaller than that of the MOS transistor 94, so that a gate voltage higher than those of the MOS transistors 92 and 96 is applied to the gate of the MOS transistor 95. As a result, the MOS transistor 96 obtains a great conduction resistance, and the potential at the source potential terminal $T_{SP}$ increases gradually.

When the source potential $V_{SP}$ becomes higher than the source potential $V_{SC}$, a high voltage is applied to the gate of the MOS transistor 96 to reduce the conduction resistance of the MOS transistor 96, thereby lowering the potential at the source potential terminal $T_{SP}$. Thus, the source potential $V_{SP}$ of the MOS FET's forming the memory cells is set to a potential level substantially equal to that of the source potential $V_{SC}$ of the MOS transistor 105.

Although illustrative embodiments of this invention have been described herein, it is to be understood that the invention is not limited to those precise embodiments, and that various changes and modifications may be effected therein by one skilled in the art without departing from the scope or spirit of the invention. For example, the N-channel MOS transistors used in the above-mentioned embodiments can be replaced by P-channel MOS transistors. Further, the resistors R1 and R2 used in the embodiments shown in FIGS. 8 and 10 may be formed of MOS transistors. Referring to FIGS. 13 and 18, furthermore, the MOS transistors 64 to 66 and 103 to 106 can be omitted so that a gate control voltage at a given level may be applied directly to the gates of the MOS transistors 62 and 98.

What we claim is:

1. A nonvolatile semiconductor memory device comprising:
    at least one memory cell consisting of an MOS transistor with a floating gate;
    at least one word line coupled to the gate of the MOS transistor of said at least one memory cell to selectively transmit an access signal to said at least one memory cell;
    at least one data line coupled to the drain of the MOS transistor of said at least one memory cell to transmit data to be transferred to and from said memory cell; and
    potential level control means, coupled to the source of the MOS transistor of said at least one memory cell, for maintaining the source potential of said MOS transistor substantially at a given level higher than the substrate potential of said MOS transistor.

2. A nonvolatile semiconductor memory device according to claim 1, wherein said potential level control means is formed of first resistance means.

3. A nonvolatile semiconductor memory device according to claim 2, wherein said potential level control means includes a series combination of a second resistance means and switching means coupled in parallel with said first resistance means.

4. A nonvolatile semiconductor memory device according to claim 1, wherein said potential level control means includes:
    a first control signal generation means having an input terminal coupled to the source of the MOS transistor of said memory cell, for producing a control signal when the voltage level of an input signal reaches a given value; and a first MOS transistor having a current path coupled to the source of the MOS transistor of said memory cell and receiving at the gate thereof the control signal from said first control signal generation means so that the conduction state of said first MOS transistor may be controlled in accordance with said control signal.

5. A nonvolatile semiconductor memory device according to claim 4, wherein said first control signal generation means includes:
   a voltage generation means to produce a voltage at the same level as a potential level that said data line will attain when energized;
   a second MOS transistor having a drain coupled to said voltage generation means and formed in the same configuration with the MOS transistor of said memory cell; and
   means for comparing the source potentials of said second MOS transistor and the MOS transistor of said memory cell and producing a control signal to change the conduction resistance of said first MOS transistor.

6. A nonvolatile semiconductor memory device according to claim 4, wherein said first control signal generation means includes a comparator circuit for comparing the source voltage of the MOS transistor for said memory cell with a first reference voltage.

7. A nonvolatile semiconductor memory device according to claim 4, wherein said first control device generation means includes an inverter circuit.

8. A nonvolatile semiconductor memory device comprising:
   a plurality of memory cells each consisting of an MOS transistory with a floating gate and arranged in the form of a matrix;
   a plurality of word lines each coupled to the gates of the MOS transistors of memory cells arranged on the same row to transmit an access signal to said memory cells;
   a plurality of data lines each coupled to the drains of the MOS transistors of memory cells arranged on the same column to transmit data to be transferred to and from said memory cells; and
   potential level control means, coupled to the sources of the MOS transistors of at least part of said plurality of memory cells, for maintaining the source potential of said MOS transistors substantially at a given level higher than the substrate potential of said MOS transistors.

9. A nonvolatile semiconductor memory device according to claim 8, wherein said potential level control means is formed of first resistance means.

10. A nonvolatile semiconductor memory device according to claim 9, wherein said potential level control means including a series combination of a second resistance means and switching means coupled in parallel with said first resistance means.

11. A nonvolatile semiconductor memory device according to claim 8, wherein said potential level control means includes:
   a first control signal generation means, having an input terminal coupled to the source of the MOS transistor of said memory cell, for producing a control signal when the voltage level of an input signal reaches a given value; and
   a first MOS transistor having a current path coupled to the sources of the MOS transistors of said memory cells and receiving at the gates thereof the control signal from said first control signal generation means so that the conduction state of said first MOS transistor may be controlled in accordance with said control signal.

12. A nonvolatile semiconductor memory device according to claim 11, wherein said first control signal generation means includes a comparator circuit for comparing the source voltage of the MOS transistors for said memory cells with a first reference voltage.

13. A nonvolatile semiconductor memory device according to claim 11, wherein said first control signal generation means includes an inverter circuit.

14. A nonvolatile semiconductor memory device according to claim 11, wherein said first control signal generation means includes:
   a voltage generation means to produce a voltage at the same level as a potential level that said data line will attain when energized;
   a second MOS transistor having a drain coupled to said voltage generation means and formed in the same configuration with the MOS transistors of said memory cells; and
   means for comparing the source potentials of said second MOS transistors and the MOS transistor of said memory cells and producing a control signal to change the conduction resistance of said first MOS transistor.

15. A nonvolatile semiconductor memory device comprising:
   at least one word line;
   a plurality of memory cells each consisting of an MOS transistor having a floating gate and a control gate coupled to said at least one word line;
   a plurality of data lines coupled selectively to the drains of the MOS transistors of said plurality of memory cells; and
   potential level control means, coupled to the sources of the MOS transistors of at least part of said plurality of memory cells, for maintaining the source potential of said MOS transistors substantially at a given level higher than the substrate potential of said MOS transistors.

16. A nonvolatile semiconductor memory device according to claim 15, wherein said potential level control means is formed of first resistance means.

17. A nonvolatile semiconductor memory device according to claim 16, wherein said potential level control means includes a series combination of a second resistance means and switching means coupled in parallel with said first resistance means.

18. A nonvolative semiconductor memory device according to claim 15, wherein said potential level control means includes:
   a first control signal generation means, having an input terminal coupled to the sources of the MOS transistors of said memory cells, for producing a control signal when the voltage level of an input signal reaches a given value; and
   a first MOS transistor having a current path coupled to the sources of the MOS transistors of said memory cells and receiving at the gate thereof the control signal from said first control signal generation means so that the conduction state of said first MOS transistor may be controlled in accordance with said control signal.

19. A nonvolatile semiconductor memory device according to claim 18, wherein said first control signal generation means includes a comparator circuit for comparing the source voltage of the MOS transistors for said memory cells with a first reference voltage.

20. A nonvolatile semiconductor memory device according to claim 18, wherein said first control signal generation means includes an inverter circuit.

21. A nonvolatile semiconductor memory device according to claim 18, wherein said first control signal generation means includes:
 a voltage generation means to produce a voltage at the same level as a potential level that said data line will attain when energized;
 a second MOS transistor having a drain coupled to said voltage generation means and formed in the same configuration with the MOS transistors of said memory cells; and
 means for comparing the source potentials of said second MOS transistor and the MOS transistors of said memory cells and producing a control signal to change the conduction resistance of said first MOS transistor.

22. A nonvolatile semiconductor memory device comprising:
 at least one memory cell including an MOS transistor with a floating gate;
 at least one word line coupled to the gate of the MOS transistor of said at least one memory cell to selectively transmit an access signal to said at least one memory cell;
 at least one data line coupled to the drain of the MOS transistor of said at least one memory cell to transmit data to be transferred to and from said memory cell; and
 potential level control means coupled to the source of the MOS transistor of said at least one memory cell, for maintaining the source potential of said MOS transistor at a level higher than the potential of the substrate of said MOS transistor, said potential level control means including:
  (i) a first control signal generation means, having an input terminal coupled to the source of the MOS transistor of said memory cell, for producing a first control signal when the voltage level of an input signal to said first control signal generation means reaches a given value,
  (ii) a first MOS transistor with a gate and having a current path coupled to the source of the MOS transistor of said memory cell and receiving at the gate thereof said first control signal from said first control signal generation means so that the conduction state of said first MOS transistor may be controlled in accordance with said first control signal,
  (iii) a second control signal generation means, having an input terminal coupled to the source of the MOS transistor of said memory cell, for producing a second control signal when the voltage level of an input signal to said second control signal generation means and reaches a given value,
  (iv) a second MOS transistor with a gate and having a current path coupled to the source of the MOS transistor of said memory cell and receiving at the gate thereof said second control signal from said second control signal generation means so that the conduction state of said second MOS transistor may be controlled in accordance with said second control signal.

23. A nonvolatile semiconductor memory device according to claim 22, wherein said first and second control signal generation means include first and second comparator circuits for comparing the source voltage of the MOS transistor of said memory cell with first and second reference voltages, and first and second switching means having current paths coupled respectively to the output terminals of said first and second comparator circuits and energized alternately.

24. A nonvolatile semiconductor memory device according to claim 22, wherein said first and second control signal generation means include first and second inverter circuits and first and second switching means having current paths coupled respectively to the output terminals of said first and second inverter circuits and energized alternately.

25. A nonvolatile semiconductor memory device comprising:
 at least one memory cell including an MOS transistor with a floating gate;
 at least one word line coupled to the gate of the MOS transistor of said at least one memory cell to selectively transmit an access signal to said at least one memory cell;
 at least one data line coupled to the drain of the MOS transistor of said at least one memory cell to transmit data to be transferred to and from said memory cell; and
 potential level control means coupled to the source of the MOS transistor of said at least one memory cell, for maintaining the source potential of said MOS transistor at a level higher than the potential of the substrate of said MOS transistor, said potential level control means including:
  (i) a first control signal generation means for producing a control signal when the voltage level of an input signal to said first control signal generation means signal reaches a given value, said first control signal generation means including an input terminal coupled to the source of the MOS transistor of said memory cell resistance means with one end coupled to a power supply terminal, and a first MOS transistor coupled between the source of the MOS transistor of said memory cell and the other end of said resistance means, said control signal being produced from a junction between said resistance means and said first MOS transistor when the voltage level of said input signal reaches a given value, and
  (ii) a second MOS transistor with a gate and having a current path coupled to the source of the MOS transistor of said memory cell and receiving at the gate thereof the control signal from said first control signal generation means so that the conduction state of said second MOS transistor may be controlled in accordance with said control signal.

26. A nonvolatile semiconductor memory device according to claim 25, wherein said first control signal generation means further includes a voltage generation means to produce a voltage at the same level as a potential level that said data line will attain when energized, and a third MOS transistor having a current path coupled between said voltage generation means and the gate of said second MOS transistor and formed in the same configuration as the MOS transistor of said memory cell.

27. A nonvolatile semiconductor memory device according to claim 25, wherein said second MOS transistor is coupled to the source of the MOS transistor of said memory cell through a resistance-type MOS transistor.

28. A nonvolatile semiconductor memory device comprising:
   a plurality of memory cells each including an MOS transistor with a floating gate and arranged in the form of a matrix with rows and columns;
   a plurality of word lines each coupled to the gates of the MOS transistors of memory cells arranged on the same row to transmit an access signal to said memory cells;
   a plurality of data lines each coupled to the drains of the MOS transistors of memory cells arranged on the same column to transmit data to be transferred to and from said memory cells; and
   potential level control means, coupled to the sources of the MOS transistors of at least part of said plurality of memory cells, for maintaining the source potential of said MOS transistors at a level higher than the potential of the substrate of said MOS transistors, said potential level control means including:
   (i) a first control signal generation means, having an input terminal coupled to the sources of the MOS transistors of said memory cells, for producing a first control signal when the voltage level of an input signal to said first control signal generation means reaches a given value,
   (ii) a first MOS transistor having a current path coupled to the sources of the MOS transistors of said memory cells and receiving at the gate thereof said first control signal from said first control signal generation means so that the conduction state of said first MOS transistor may be controlled in accordance with said first control signal,
   (iii) a second control signal generation means, having an input terminal coupled to the sources of the MOS transistors of said memory cells, for producing a second control signal when the voltage level of an input signal to said second control signal generation means reaches a given value, and
   (iv) a second MOS transistor having a current path coupled to the sources of the MOS transistors of said memory cells and receiving at the gate thereof said second control signal from said second control signal generations means so that the conduction state of said second MOS transistor may be controlled in accordance with said second control signal.

29. A nonvolatile semiconductor memory device according to claim 28, wherein said first and second control signal generation means include first and second comparator circuits for comparing the source voltage of the MOS transistors of said memory cells with first and second reference voltages, and first and second switching means having current paths coupled respectively to the output terminals of said first and second comparator circuits and energized alternately.

30. A nonvolatile semiconductor memory device according to claim 28, wherein said first and second control signal generation means include first and second inverter circuits and first and second switching means having current paths coupled respectively to the output terminals of said first and second inverter circuits and energized alternately.

31. A nonvolatile semiconductor memory device comprising: a plurality of memory cells each including an MOS transistor with a floating gate and arranged in the form of a matrix having rows and columns;
   a plurality of word lines each coupled to the gates of the MOS transistors of memory cells arranged on the same row to transmit an access signal to said memory cells;
   a plurality of data lines each coupled to the drains of the MOS transistors of memory cells arranged on the same column to transmit data to be transferred to and from said memory cells; and
   potential level control means, coupled to the sources of the MOS transistors of at least part of said plurality of memory cells, for maintaining the source potential of said MOS transistors at a level higher than the potential of the substrate of said MOS transistors, said potential level control means including:
   (i) a first control signal generation means for producing a control signal when the voltage level of an input signal to said first control signal generation means reaches a given value, said first control signal generation means including an input terminal coupled to the source of the MOS transistors of said memory cells, resistance means with one end coupled to a power supply terminal, and a first MOS transistor coupled between the sources of the MOS transistors of said memory cells and the other end of said resistance means, said control signal being produced from a junction between said resistance means and said first MOS transistor when the voltage level of said input signal reaches a given value, and
   (ii) a second MOS transistor having a current path coupled to the sources of the MOS transistors of said memory cells and receiving at the gates thereof the control signal from said first control signal generation means so that the conduction state of said second MOS transistor may be controlled in accordance with said control signal.

32. A nonvolatile semiconductor memory device according to claim 31, wherein said first control signal generation means further includes a voltage generation means to produce a voltage at the same level as a potential level that said data line will attain when energized, and a third MOS transistor having a current path coupled between said voltage generation means and the gate of said second MOS transistor and formed in the same configuration as the MOS transistor of said memory cell.

33. A nonvolatile semiconductor memory device according to claim 31, wherein said first MOS transistor is coupled to the source of the MOS transistor of said memory cell through a resistance-type MOS transistor.

34. A nonvolatile semiconductor memory device comprising:
   at least one word line;
   a plurality of memory cells each including an MOS transistor having a floating gate and a control gate coupled to said at least one word line;
   a plurality of data lines coupled selectively to the drains of the MOS transistors of said plurality of memory cells; and
   potential level control means coupled to the sources of the MOS transistors of at least part of said plurality of memory cells, for maintaining the source potential of said MOS transistors at a level higher than the potential of the substrate of said MOS transistors, and said potential level control means including:

(i) a first control signal generation means, having an input terminal coupled to the source of the MOS transistors of said memory cells, for producing a first control signal when the voltage level of an input signal to said first control signal generation means reaches a given value, (ii) a first MOS transistor having a current path coupled to the source of the MOS transistors of said memory cells and receiving at the gates thereof said first control signal from said first control signal generations means so that the conduction state of said first MOS transistor may be controlled in accordance with said first control signal, (iii) a second control signal generation means, having an input terminal coupled to the sources of the MOS transistors of said memory cells for producing a second control signal when the voltage level of an input signal to said second control signal generation means reaches a given value, and (iv) a second MOS transistor having a current path coupled to the sources of the MOS transistors of said memory cells and receiving at the gates thereof said second control signal from said second control signal generation means so that the conduction state of said second MOS transistor may be controlled in accordance with said second control signal.

35. A nonvolatile semiconductor memory device according to the claim 34, wherein said first and second control signal generation means include first and second comparator circuits for comparing the source voltage of the MOS transistors of said memory cells with first and second reference voltages, and first and second switching means having current paths coupled respectively to the output terminals of said first and second comparator circuits and energized alternately.

36. A nonvolatile semiconductor memory device according to claim 34, wherein said first and second control signal generation means includes first and second inverter circuits and first and second switching means having current paths coupled respectively to the output terminals of said first and second inverter circuits and energized alternately.

37. A nonvolatile semiconductor memory device comprising:
at least one word line;
a plurality of memory cells each including an MOS transistor having a floating gate and a control gate coupled to said at least one word line;
a plurality of data lines coupled selectively to the drains of the MOS transistors of said plurality of memory cells; and
potential level control means, coupled to the sources of the MOS transistors of at least part of said plurality of memory cells, for maintaining the source potential of said MOS transistors at a level higher than the potential of the substrate of said MOS transistors, said potential level control means including:

(i) a first control signal generation means for producing a control signal when the voltage level of an input signal to said first control signal generation means reaches a given value, said first control signal generation means including an input terminal coupled to the source of the MOS transistors of said memory cells, resistance means with one end coupled to a power supply terminal, and a first MOS transistor coupled between the source of the MOS transistors of said memory cells and the other end of said resistance means, said control signal being produced from a junction between said resistance means and said first MOS transistor when the voltage level of said input signal reaches a given value, and (ii) a second MOS transistor having a current path coupled to the sources of the MOS transistors of said memory cells and receiving at the gates thereof the control signal from said first control signal generation means so that the conduction state of said second MOS transistor may be controlled in accordance with said control signal.

38. A nonvolatile semiconductor memory device according to claim 37, wherein said first control signal generation means further includes a voltage generation means to produce a voltage at the same level as a potential level that said data line will attain when energized, and a third MOS transistor having a current path coupled between said voltage generation means and the gate of said second MOS transistor and formed in the same configuration as the MOS transistors of said memory cells.

39. A nonvolatile semiconductor memory device according to claim 37, wherein said first MOS transistor is coupled to the sources of the MOS transistors of said memory cells through a resistance-type MOS transistor.

* * * * *